United States Patent
Mahajani

(10) Patent No.: US 7,776,395 B2
(45) Date of Patent: Aug. 17, 2010

(54) METHOD OF DEPOSITING CATALYST ASSISTED SILICATES OF HIGH-K MATERIALS

(75) Inventor: Maitreyee Mahajani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 703 days.

(21) Appl. No.: 11/559,486

(22) Filed: Nov. 14, 2006

(65) Prior Publication Data

US 2008/0113096 A1    May 15, 2008

(51) Int. Cl.
 *C23C 16/00*    (2006.01)
(52) U.S. Cl. .............. 427/250; 427/248.1; 118/722; 556/400; 556/463
(58) Field of Classification Search ............. 427/250, 427/248.1; 118/722; 556/400, 463
See application file for complete search history.

(56) References Cited

U.S. PATENT DOCUMENTS

| | | | |
|---|---|---|---|
| 6,090,442 A | 7/2000 | Klaus et al. | |
| 6,391,803 B1 | 5/2002 | Kim et al. | |
| 6,495,479 B1 * | 12/2002 | Wu et al. | 438/781 |
| 6,548,047 B1 | 4/2003 | Unger | |
| 6,613,383 B1 | 9/2003 | George et al. | |
| 6,713,177 B2 | 3/2004 | George et al. | |
| 6,716,412 B2 | 4/2004 | Unger | |
| 6,818,250 B2 | 11/2004 | George et al. | |
| 6,872,843 B2 | 3/2005 | Schottek et al. | |
| 6,913,827 B2 | 7/2005 | George et al. | |
| 6,958,174 B1 | 10/2005 | Klaus et al. | |
| 6,969,539 B2 | 11/2005 | Gordon et al. | |
| 6,992,019 B2 | 1/2006 | Lee et al. | |
| 7,052,990 B2 | 5/2006 | Kim | |
| 7,077,904 B2 | 7/2006 | Cho et al. | |
| 7,084,076 B2 | 8/2006 | Park et al. | |
| 7,087,485 B2 | 8/2006 | Seidl et al. | |
| 7,592,251 B2 * | 9/2009 | Ahn et al. | 438/637 |
| 2002/0018849 A1 | 2/2002 | George et al. | |

(Continued)

FOREIGN PATENT DOCUMENTS

CN    1734727    2/2006

(Continued)

OTHER PUBLICATIONS

Jill Svenja Becker, Ph.D. Thesis Harvard University, Cambridge, MA (2002), pp. 106-117 and pp. 25 and 64.*

(Continued)

*Primary Examiner*—Nadine G Norton
*Assistant Examiner*—Maki A Angadi
(74) *Attorney, Agent, or Firm*—Patterson & Sheridan, LLP

(57) ABSTRACT

A high-k silicate atomic layer deposition method is disclosed. To produce a hafnium silicate layer, a substrate may be exposed to a pulse of a hafnium precursor, a pulse of an oxidizer, a pulse of a silicon precursor, and a pulse of another oxidizer. A catalyst may additionally be co-flowed with one or more reactants into the chamber through a separate inlet. Alternatively, the catalyst may be flowed to the chamber before the reactant is introduced in a soaking procedure. By either co-flowing the catalyst through separate inlets or by performing a catalyst soak, hafnium silicate formation may proceed at a fast rate and/or at a low temperature.

26 Claims, 6 Drawing Sheets

U.S. PATENT DOCUMENTS

| | | | |
|---|---|---|---|
| 2004/0018694 A1 | 1/2004 | Lee et al. | |
| 2004/0084774 A1 | 5/2004 | Li et al. | |
| 2004/0194691 A1 | 10/2004 | George et al. | |
| 2005/0012975 A1 | 1/2005 | George et al. | |
| 2005/0037565 A1 | 2/2005 | Seidl et al. | |
| 2005/0048765 A1 | 3/2005 | Kim | |
| 2005/0056219 A1* | 3/2005 | Dip et al. ............ | 118/722 |
| 2005/0095830 A1 | 5/2005 | Weidman et al. | |
| 2005/0136193 A1 | 6/2005 | Weidman et al. | |
| 2005/0161338 A1 | 7/2005 | Fang et al. | |
| 2005/0227007 A1 | 10/2005 | Bradley et al. | |
| 2005/0271813 A1 | 12/2005 | Kher et al. | |
| 2006/0040510 A1 | 2/2006 | Lee et al. | |
| 2006/0070574 A1 | 4/2006 | Derderian et al. | |
| 2006/0090694 A1* | 5/2006 | Cho et al. ............ | 117/104 |
| 2006/0141155 A1 | 6/2006 | Gordon et al. | |

FOREIGN PATENT DOCUMENTS

| | | |
|---|---|---|
| WO | WO 2005/117086 | 12/2005 |

OTHER PUBLICATIONS

European Search Report dated Dec. 21, 2007 for European Application No. 07021811.0.

Cameron, et al. "Atomic Layer Deposition of $SiO_2$ and $TiO_2$ in Alumina Tubular Membranes," Langmuir, vol. 16, No. 19, American Chemical Society, 2000 pp. 7435-7444.

Du, et al. "$SiO_2$ Film Growth at Low Temperature by Catalyzed Atomic Layer Deposition in a Viscous Flow Reactor," Thin Solid Films, 491, (2005), pp. 43-53.

Elam, et al. "Nucleation and Growth During Tungsten Atomic Layer Deposition on $SiO_2$ Surfaces," Thin Solid Films, 386, (2001), pp. 41-52.

Ferguson, et al. "ALD of $SiO_2$ at Room Temperature Using TEOS and $H_2O$ with $NH_3$ as the Catalyst," Journal of The Electrochemical Society, 151, (8), pp. G528-G535 (2004).

Ferguson, et al. "Atomic Layer Deposition of $Al_2O_3$ and $SiO_2$ on BN Particles Using Sequential Surface Reactions," Applied Surface Science, 162-163, (2000), pp. 280-292.

Ferguson, et al. "Atomic Layer Deposition of $SiO_2$ Films on BN Particles Using Sequential Surface Reactions," Chem. Mater., vol. 12, No. 11, 2000, pp. 3472-3480.

Groner, et al. "High-κ Dielectrics Grown by Atomic Layer Deposition: Capacitor and Gate Applications," Interlayer Dielectrics for Semiconductor Technologies, Chapter 10, Elsevier Inc., 2003, pp. 327-348.

Hausmann, et al. "Rapid Vapor Deposition of Highly Conformal Silica Nanolaminates," Science, vol. 298, Oct. 11, 2002, pp. 402-406.

He, et al, "Pulsed Deposition of Silicate Films," Journal of Applied Physics, vol. 94, No. 5, Sep. 1, 2003, pp. 3657-3659.

Jiang, et al. "Infrared Method for In Situ Studies of Polymer/Surfactant Adsorption on Silica Powders from Aqueous Solution," Applied Spectroscopy, vol. 57, No. 11, 2003, pp. 1419-1424.

Kang, et al. "Infrared Spectroscopic Study of Atomic Layer Deposition Mechanism for Hafnium Silicate Thin Films Using $HfCl_2$ $[N(SiMe_3)_2]_2$ and $H_2O$," J. Vac. Sci. Technol. A 22(6), Nov./Dec. 2004, American Vacuum Society, pp. 2393-2397.

Klaus, et al. "Atomic Layer Controlled Growth of $SiO_2$ Films Using Binary Reaction Sequence Chemistry," Appl. Phys. Lett. 70(9), Mar. 3, 1997. pp. 1092-1094.

Klaus, et al. "Atomic Layer Deposition of $SiO_2$ at Room Temperature Using $NH_3$-Catalyzed Sequential Surface Reactions," Surface Science 447 (2000) Elsevier Science, pp. 81-90.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999), pp. 435-448.

Klaus, et al. "Growth of $SiO_2$ at Room Temperature with the Use of Catalyzed Sequential Half-Reactions," Science, vol. 278, Dec. 12, 1997, pp. 1934-1936.

Klaus, et al. "$SiO_2$ Chemical Vapor Deposition at Room Temperature Using $SiCl_4$ and $H_2O$ with an $NH_3$ Catalyst," Journal of the Electrochemical Society, 147 (7), 2000, pp. 2658-2664.

McCool, et al. "Self-Limited Pore Size Reduction of Mesoporous Silica Membranes via Pyridine-Catalyzed Silicon Dioxide ALD," Chem. Vap. Deposition, 2004, vol. 10, No. 4, pp. 190-194.

McCool, et al. "Synthesis and Characterization of Silica Membrane Prepared by Pyridine-Catalyzed Atomic Layer Deposition," Ind. Eng. Chem. Res., vol. 43, No. 10, 2004, pp. 2478-2484.

Morishita, et al. "New Substances for Atomic-Layer Deposition of Silicon Dioxide," Journal of Non-Crystalline Solids, vol. 187 (1995), pp. 66-69.

Rana, et al. "Interactions of Moisture and Organic Contaminants with $SiO_2$ and $ZrO_2$ Gate Dielectric Films," Applied Surface Science, vol. 205, (2003), pp. 160-175.

Yamaguchi, et al. "Atomic-Layer Chemical-Vapor-Deposition of Silicon Dioxide Films with an Extremely Low Hydrogen Content," Applied Surface Science, 130-132 (1998), pp. 202-207.

Chinese Office Action dated May 8, 2009 for Application No. 2007101871014.

* cited by examiner

METHOD OF DEPOSITING CATALYST ASSISTED SILICATES OF HIGH-K MATERIALS

CROSS-REFERENCE TO RELATED APPLICATIONS

This application is related to co-pending U.S. patent application Ser. No. 11/559,491, filed on an even date herewith, and herein incorporated by reference.

BACKGROUND OF THE INVENTION

1. Field of the Invention

Embodiments of the present invention generally relate to a method of depositing a hafnium silicate layer on a substrate by atomic layer deposition (ALD).

2. Description of the Related Art

In the field of semiconductor processing, flat-panel display processing or other electronic device processing, vapor deposition processes have played an important role in depositing materials onto substrates. As the geometries of electronic devices continue to shrink and the density of devices continues to increase, the size and aspect ratio of the features are becoming more aggressive. Accordingly, conformal deposition of materials to form these devices is becoming increasingly important.

While conventional chemical vapor deposition (CVD) has proved successful for device geometries and aspect ratios down to about 0.15 µm, the more aggressive device geometries require an alternative deposition technique. One technique that is receiving considerable attention is ALD. During an ALD process, reactant gases are sequentially introduced into a process chamber containing a substrate. Generally, a first reactant is pulsed into the process chamber and is adsorbed onto the substrate surface. A second reactant is then pulsed into the process chamber and reacts with the first reactant to form a deposited material. Pump and/or purge steps may be carried out between the delivery of each reactant gas. The purge step may be a continuous purge with a carrier gas or a pulse purge between the delivery of the reactant gases.

The formation of hafnium silicate by ALD is a process that is known in the art. In forming hafnium silicate by ALD, a hafnium precursor may be pulsed into the chamber followed by an oxidizing source. Thereafter, a silicon precursor may be pulsed into the chamber followed by an oxidizing source. Oxidizing sources present many challenges when depositing high-k silicates due to the reactivity of the oxidizing source with the catalyst.

Therefore, there is a need in the art for a method of depositing catalyst assisted silicates of high-k materials in ALD.

SUMMARY OF THE INVENTION

A hafnium silicate ALD method is disclosed to exemplify high-k silicon methods. To produce a hafnium silicate layer, a substrate may be exposed to a pulse of a hafnium precursor, a pulse of an oxidizer, a pulse of a silicon precursor, and a pulse of another oxidizer. A catalyst may additionally be co-flowed with one or more reactants into the chamber through a separate inlet. Alternatively, the catalyst may be flowed to the chamber before the reactant is introduced in a soaking procedure. By either co-flowing the catalyst through separate inlets or by performing a catalyst soak, hafnium silicate formation may proceed at a fast rate and/or at a low temperature.

In one embodiment, a hafnium silicate deposition method is disclosed. The method comprises sequentially positioning a substrate in a chamber, exposing the substrate to a hafnium precursor, exposing the substrate to a first catalyst soak, exposing the substrate to a first oxidizing source, exposing the substrate to a silicon precursor, exposing the substrate to a second catalyst soak, and then exposing the substrate to a second oxidizing source.

In another embodiment, a hafnium silicate deposition method is disclosed. The method comprises sequentially positioning a substrate in a chamber, exposing the substrate to a hafnium precursor, exposing the substrate to a first oxidizing source and a first catalyst wherein the first catalyst and first oxidizing source flow into the chamber through separate inlets, exposing the substrate to a silicon precursor, and then exposing the substrate to a second oxidizing source and a second catalyst, wherein the second catalyst and the second oxidizing source flow into the chamber through separate inlets.

In yet another embodiment, a hafnium silicate deposition method is disclosed. The method comprises sequentially positioning a substrate in a chamber, exposing the substrate to a hafnium precursor, exposing the substrate to water and pyridine wherein the water and pyridine flow into the chamber through separate inlets, exposing the substrate to hexachlorodisilane, and then exposing the substrate to water and pyridine, wherein the water and pyridine flow into the chamber through separate inlets.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

A hafnium silicate ALD method is described to exemplify high-k silicon methods. To produce a hafnium silicate layer, a substrate may be exposed to a pulse of a hafnium precursor, a pulse of an oxidizer, a pulse of a silicon precursor, and a pulse of another oxidizer. A catalyst may additionally be co-flowed with one or more reactants into the chamber through a separate inlet. Alternatively, the catalyst may be flowed to the chamber before the reactant is introduced in a soaking procedure. By either co-flowing the catalyst through separate inlets or by performing a catalyst soak, hafnium silicate formation may proceed at a fast rate and/or at a low temperature.

Figure 1A:
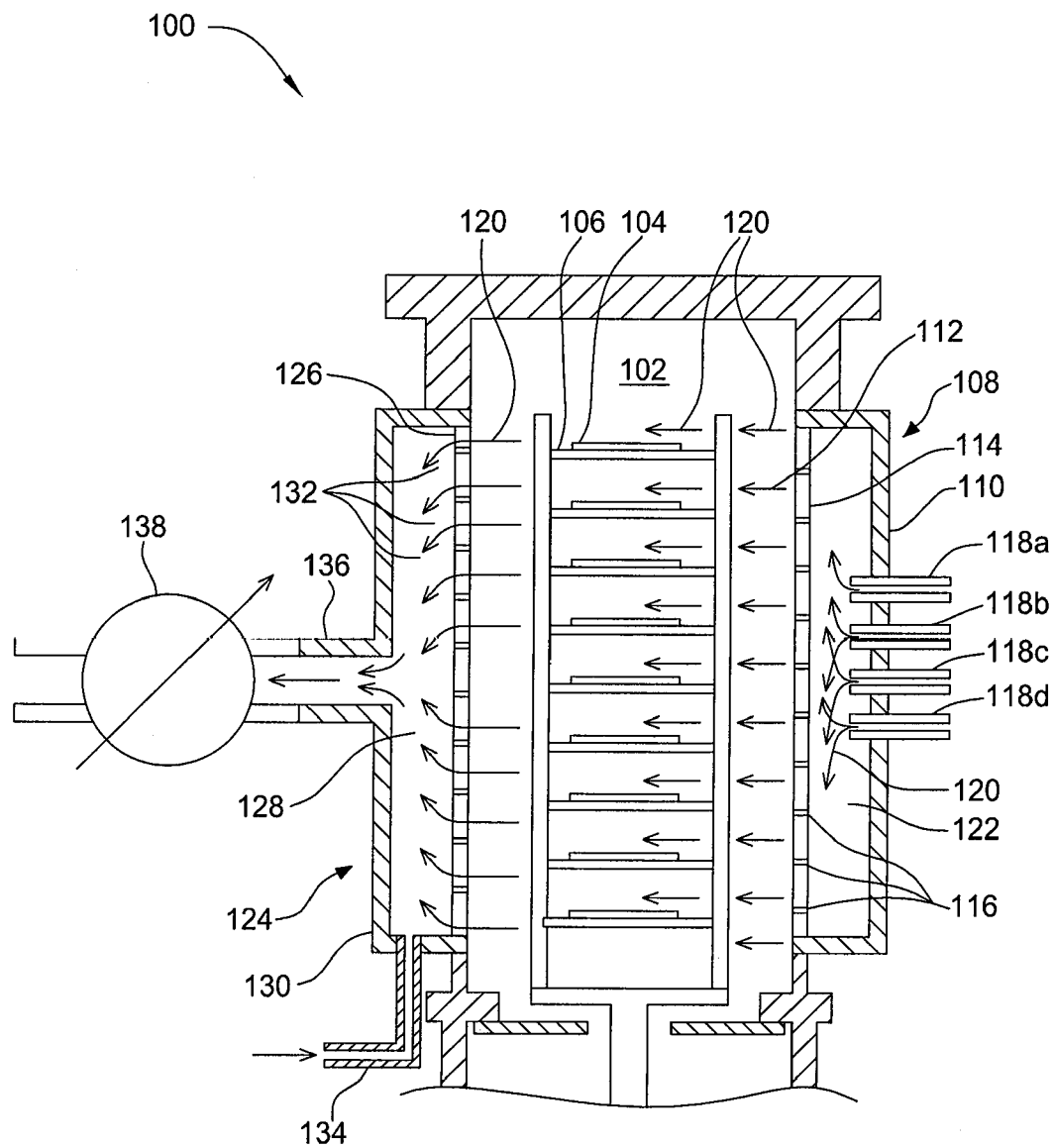
FIG. 1A is a schematic representation of an apparatus 100 according to one embodiment of the invention.

FIG. 1A is a schematic representation of an apparatus 100 according to one embodiment of the invention. The apparatus 100 comprises a vacuum chamber 102. The apparatus 100 may be a batch apparatus 100 that may contain one or more susceptors 106 upon which a substrate 104 may be placed. In one embodiment, the apparatus 100 may be a single substrate 104 apparatus. In another embodiment, a wafer boat may be used that may hold one or more substrates without susceptors. It is beneficial to process more than one substrate 104 simultaneously in order to increase throughput. One challenge posed with batch processes is maintaining a wafer to wafer uniformity.

Precursors may be fed to the apparatus 100 through an injector plenum 108. The injector plenum 108 may comprise a plenum wall 110 and an injection plate 114 that together surround and define an injection plenum chamber 122. The injection plate 114 has a plurality of holes 116 through which the precursor gas, purge gas, and carrier gas may flow 120 into the vacuum chamber 102. The injection plate 114 separates the injector plenum 108 from the vacuum chamber 102 so that the vacuum chamber 102 is the low pressure side 112 of the injector plenum 108. The precursors, purge gas, and carrier gas may be introduced to the injector plenum 108 through conduits 118a-118d.

The apparatus 100 may be exhausted through an exhaust plenum 124. The exhaust plenum may comprise an exhaust plate 126 and a plenum wall 130 that enclose and define an exhaust plenum chamber 128. A plurality of holes 132 may be present in the exhaust plate 126. The gases are exhausted from the exhaust plenum 124 through the exhaust port 136.

Additional gas may be introduced to the exhaust plenum 124 through conduit 134. The additional gas may abate or convert reaction by-products that may otherwise condense on surfaces of the exhaust plenum 124 and the vacuum chamber 102. A throttle valve 138 may control the vacuum chamber 102 pressure.

When forming high-k silicates by ALD, high-k precursors, such as hafnium precursors, may be delivered to the apparatus 100. Exemplary hafnium precursors that may be used to deposit a hafnium silicate layer include hafnium compounds containing ligands such as halides, alkylaminos, cyclopentadienyls, alkyls, alkoxides, derivatives thereof or combinations thereof. Hafnium halide compounds useful as hafnium precursors may include $HfCl_4$, $HfI_4$, and $HfBr_4$. Hafnium alkylamino compounds useful as hafnium precursors include $(RR'N)_4Hf$, where R or R' are independently hydrogen, methyl, ethyl, propyl or butyl. Hafnium precursors useful for depositing hafnium-containing materials include $(Et_2N)_4Hf$ (TDEAH), $(Me_2N)_4Hf$ (TDMAH), $(MeEtN)_4Hf$ (TEMAH), $(^tBuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(^iPrC_5H_4)_2HfCl_2$, $(^iPrC_5H_4)HfCl_3$, $(^tBuC_5H_4)_2HfMe_2$, $(acac)_4Hf$, $(hfac)_4Hf$, $(tfac)_4Hf$, $(thd)_4Hf$, $(NO_3)_4Hf$, $(^tBuO)_4Hf$, $(^iPrO)_4Hf$, $(EtO)_4Hf$, $(MeO)_4Hf$ or derivatives thereof.

It should be understood that while the invention has been described above in relation to hafnium silicate, the invention is also applicable to other high-k materials such as silicates containing Al, Zr, La, and Sr. Examples of high-k precursors that may be used may be found in United States Patent Publication No. 2006/0019033 A1, which is hereby incorporated by reference.

Silicon precursors may also be delivered to the apparatus 100. Exemplary silicon precursors useful for depositing hafnium silicate include silanes, alkylsilanes, aminosilanes, alkylaminosilanes, silanols, or alkoxy silanes. For example, silicon precursors may include $(Me_2N)_4Si$, $(Me_2N)_3SiH$, $(Me_2N)_2SiH_2$, $(Me_2N)SiH_3$, $(Et_2N)_4Si$, $(Et_2N)_3SiH$, $(MeEtN)_4Si$, $(MeEtN)_3SiH$, $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, $MeSi(OH)_3$, $Me_2Si(OH)_2$, $(MeO)_4Si$, $(EtO)_4Si$, or derivatives thereof. Other alkylaminosilane compounds useful as silicon precursors include $(RR'N)_{4-n}SiH_n$, where R or R' are independently hydrogen, methyl, ethyl, propyl or butyl and n=0-3. Other alkoxy silanes may be described by the generic chemical formula $(RO)_{4-n}SiL_n$, where R=methyl, ethyl, propyl or butyl and L=H, OH, F, Cl, Br or I and mixtures thereof. Also, higher silanes may be used as silicon precursors within some embodiments of the invention. Higher silanes are disclosed in commonly assigned United States Patent Publication No. US 2004/0224089 A1, which is incorporated herein by reference in its entirety. In some embodiments, the silicon precursor may comprise tris(dimethylamino)silane (($Me_2N$)$_3$SiH or Tris-DMAS), tetrakis(dimethylamino)silane (($Me_2N$)$_4$Si or TDMAS) or other dialkylaminosilanes, while in other embodiments the silicon precursor may comprise silane ($SiH_4$) or silanol. In yet another embodiment, the silicon precursor may comprise hexachlorodisilane (HCDS). In still another embodiment, the silicon precursor may comprise tetrakis-ethoxy-silane (TEOS).

The oxidizing source for forming hafnium silicate in an ALD process may comprise oxygen ($O_2$), ozone ($O_3$), atomic-oxygen (O), hydrogen peroxide ($H_2O_2$), nitrous oxide ($N_2O$), nitric oxide (NO), dinitrogen pentoxide ($N_2O_5$), nitrogen dioxide ($NO_2$), water ($H_2O$), alcohols, derivatives thereof or combinations thereof. In the exemplified embodiments, the oxidizing source comprises water ($H_2O$).

When using water as the oxidizing source, a catalyst is supplied to allow the ALD to proceed at a faster rate and a lower temperature than occurs in absence of the catalyst. Examples of catalysts that may be used include ammonia and pyridine. Pyridine and water may interact. Therefore, when water and pyridine are co-flowed together through the same input conduit to the chamber, the water and pyridine may interact prior to reaching the chamber. When the water and the pyridine interact, the pyridine no longer effectively functions as a catalyst and hence, the ALD deposition rate is not increased.

Figure 1B:
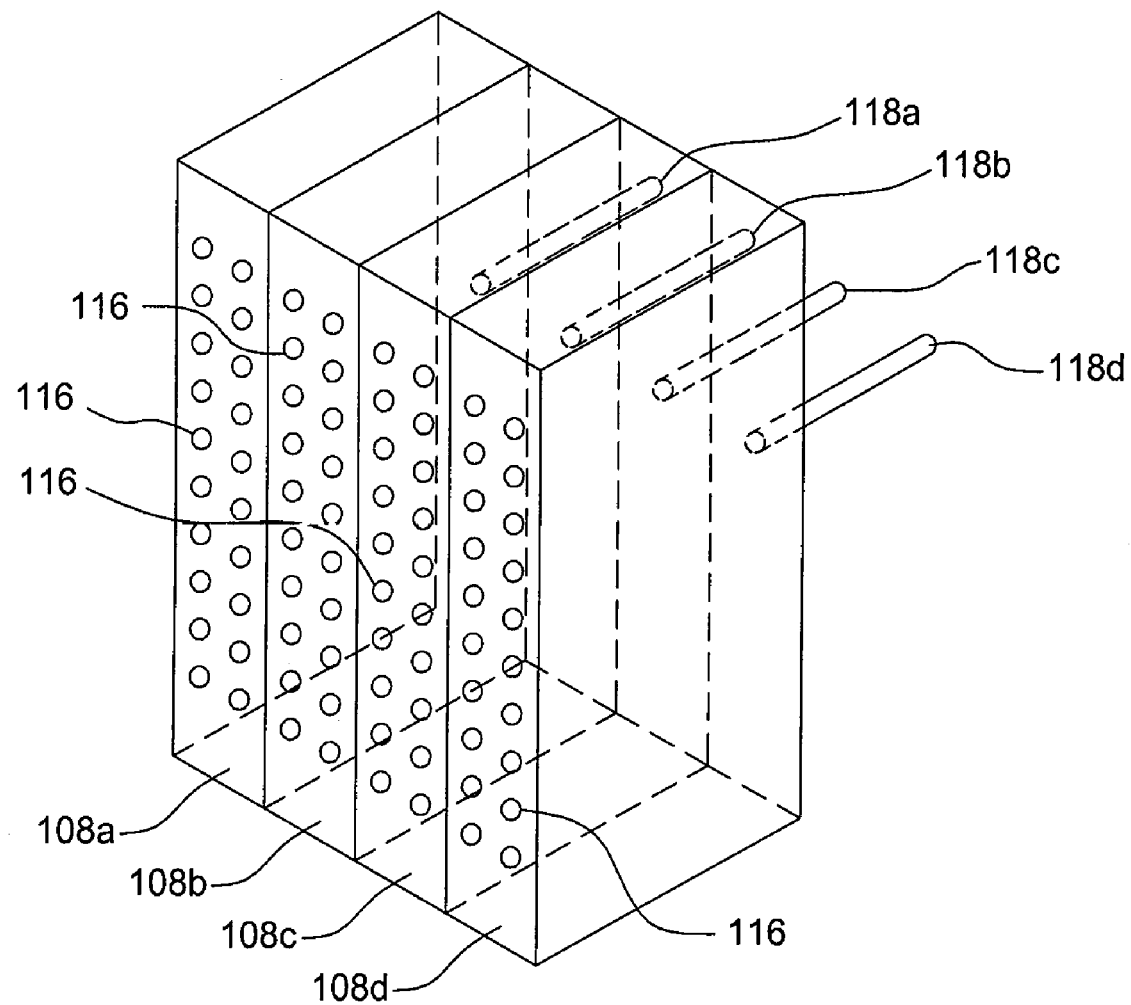
FIG. 1B is a schematic representation of injector plenums 108a-c according to one embodiment of the invention.

To prevent water and pyridine interaction prior to reaching the chamber, pyridine and water may be co-flowed to the chamber using separate feed conduits to separate injector plenums. FIG. 1B is a schematic representation of injector plenums 108a-c according to one embodiment of the invention. As shown in FIG. 1B, each conduit 118a-118d is fed to a separate injector plenum 108a-108d. Thus, pyridine-water interaction may be prevented until the pyridine and water reach the chamber.

Silicon precursors such as HCDS and TEOS and hafnium precursors such as TDMAH, TEMAH, TDEAH, and $HfCl_4$ do not interact with pyridine. Therefore, the silicon precursor and the pyridine may be co-flowed to the chamber using the same conduit and injector plenum. In one embodiment, the pyridine and the silicon precursor may be flowed to the chamber using the same conduit and injector plenum. In another embodiment, the pyridine and the silicon precursor may be flowed to the chamber using separate conduit and injector plenums. Additionally, the hafnium precursor and the pyridine may be co-flowed to the chamber using the same conduit and injector plenum. In one embodiment, the pyridine and the hafnium precursor may be flowed to the chamber using the same conduit and injector plenum. In another embodiment, the pyridine and the hafnium precursor may be flowed to the chamber using separate conduit and injector plenums.

An alternative to co-flowing pyridine and water to the chamber using separate injector plenums and conduit is to expose the substrate to a pyridine soak prior to introducing the water to the chamber. A pyridine soak may comprise exposing the substrate to pyridine without introduction of other precursors or oxidizers such as water. The substrate may be exposed to the pyridine for a time sufficient to saturate the substrate with pyridine. In one embodiment, the pyridine soak occurs for greater than about 10 seconds. By performing a pyridine soak, sufficient catalyst may be present within the chamber and at the substrate surface to ensure that catalyst is present when the water precursor is introduced. Because the pyridine is already in the chamber, all of the pyridine may not be consumed by interacting with the water prior to reaching the chamber. When a pyridine soak is performed, additional pyridine may be co-flowed with the oxidizer, with the silicon precursor, and with the hafnium precursor as desired. In one embodiment, a pyridine soak is performed and continues to flow into the chamber as the silicon precursor and subsequently the water is delivered to the chamber. In another embodiment, the pyridine soak is performed and pyridine delivery is stopped during water delivery and silicon precursor delivery. In yet another embodiment, a pyridine soak is performed and continues to flow into the chamber as the hafnium precursor and subsequently the water is delivered to the chamber. In still another embodiment, the pyridine soak is performed and pyridine delivery is stopped during water delivery and hafnium precursor delivery. The pyridine allows the reaction to occur at low temperatures such as from about 100 degrees Celsius to about 300 degrees Celsius. In one embodiment, the temperature range is about 150 degrees Celsius to about 200 degrees Celsius. As the temperature is lowered, the growth rate of the hafnium silicate increases.

When using ammonia as the catalyst, an ammonia soak may be performed in a manner similar to that described above in relation to the pyridine soak. The ammonia may be co-flowed to the chamber with the hafnium and silicon precursors using the same or separate inlets. The ammonia flow may also be discontinued while the precursors are flowed to the chamber. The ammonia may additionally be provided to the chamber while the oxidizing source is provided to the chamber. The ammonia may be provided using the same inlet or separate inlets from the oxidizing source. Additionally, the ammonia soak may or may not be present before the introduction of the oxidizing source.

Figure 2:
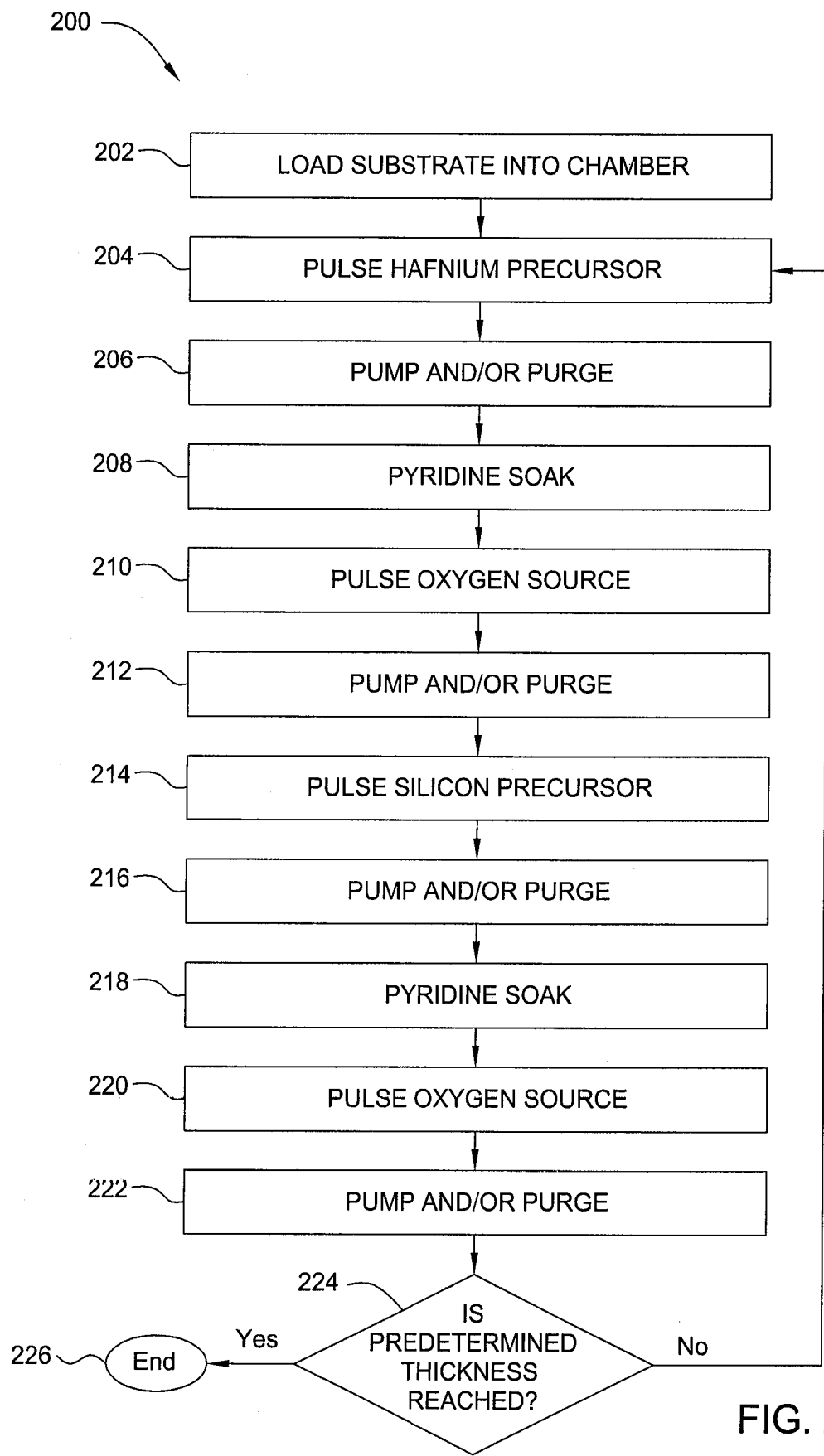
FIG. 2 is a flow chart 200 of a deposition method according to one embodiment of the invention.

FIG. 2 is a flow chart 200 of a deposition method according to one embodiment of the invention. Initially, one or more substrates may be placed into the process chamber (Step 202). The substrates may then optionally be exposed to a pyridine soak. The pyridine soak may occur for at least 10 seconds. Following the optional pyridine soak, a pulse of hafnium precursor may be introduced to the chamber (Step 204). While the hafnium precursor is introduced to the chamber, the pyridine may optionally be provided to the chamber.

Following the pulse of hafnium precursor, the chamber may be purged and/or pumped (Step 206). Exemplary purge gases that may be used include inert gases such as argon. In one embodiment, the purge gas may comprise nitrogen. The chamber may be pumped to remove the purge gas and any remaining hafnium precursor that may be present in the chamber. In one embodiment, the pumping is not performed so that only a purging step is performed. Alternatively, the purge step may be eliminated so that the chamber is pumped to remove the hafnium precursor. In one embodiment, the pumping may occur both before and after the purge gas introduction. In another embodiment, both the purging and the pumping may be repeated. The pumping and/or purging may occur a plurality of times. In yet another embodiment, the purging and the pumping may be combined into one step.

Following the pumping and/or purging, a pyridine soak may occur (Step 208). After the first pyridine soak, a pulse of oxygen source such as water may be introduced to the chamber (Step 210). While the oxygen source is introduced to the chamber, pyridine may optionally be co-flowed into the chamber. If pyridine is co-flowed into the chamber with water, the pyridine and water will have separate inlets into the chamber so that the water and the pyridine do not flow to the chamber through the same conduit and inlet at the same time.

After the pulse of oxygen source has been provided to the chamber, the chamber may be pumped and/or purged again as described above (Step 212). After the pumping and/or purging, another pyridine soak may optionally occur. Thereafter, a silicon precursor may be pulsed into the chamber (Step 214). While the silicon precursor is introduced to the chamber, the pyridine may optionally be provided to the chamber. Following the silicon precursor pulse, the chamber may again be pumped and/or purged (Step 216).

Following the pumping and/or purging, the substrate may be exposed to another pyridine soak (Step 218). The pyridine soak may occur under the same processing conditions present for the pyridine soaks discussed above. Following the pyridine soak, a pulse of oxidizing source such as $H_2O$ may be introduced to the chamber (Step 220). Because pyridine is already present within the chamber from the soak step, sufficient pyridine is present to act as a catalyst. Following the exposure of the substrate to the oxidizing source such as $H_2O$, another pumping and/or purging cycle (Step 222) may be performed under conditions as discussed above.

After the chamber has been pumped and/or purged, the thickness of the hafnium silicate layer may be measured to determine if the predetermined thickness of hafnium silicate has been reached (Step 224). If the predetermined thickness has not been reached, the deposition sequence may be repeated. If the predetermined thickness has been reached, then the process ends (Step 226).

Figure 3:
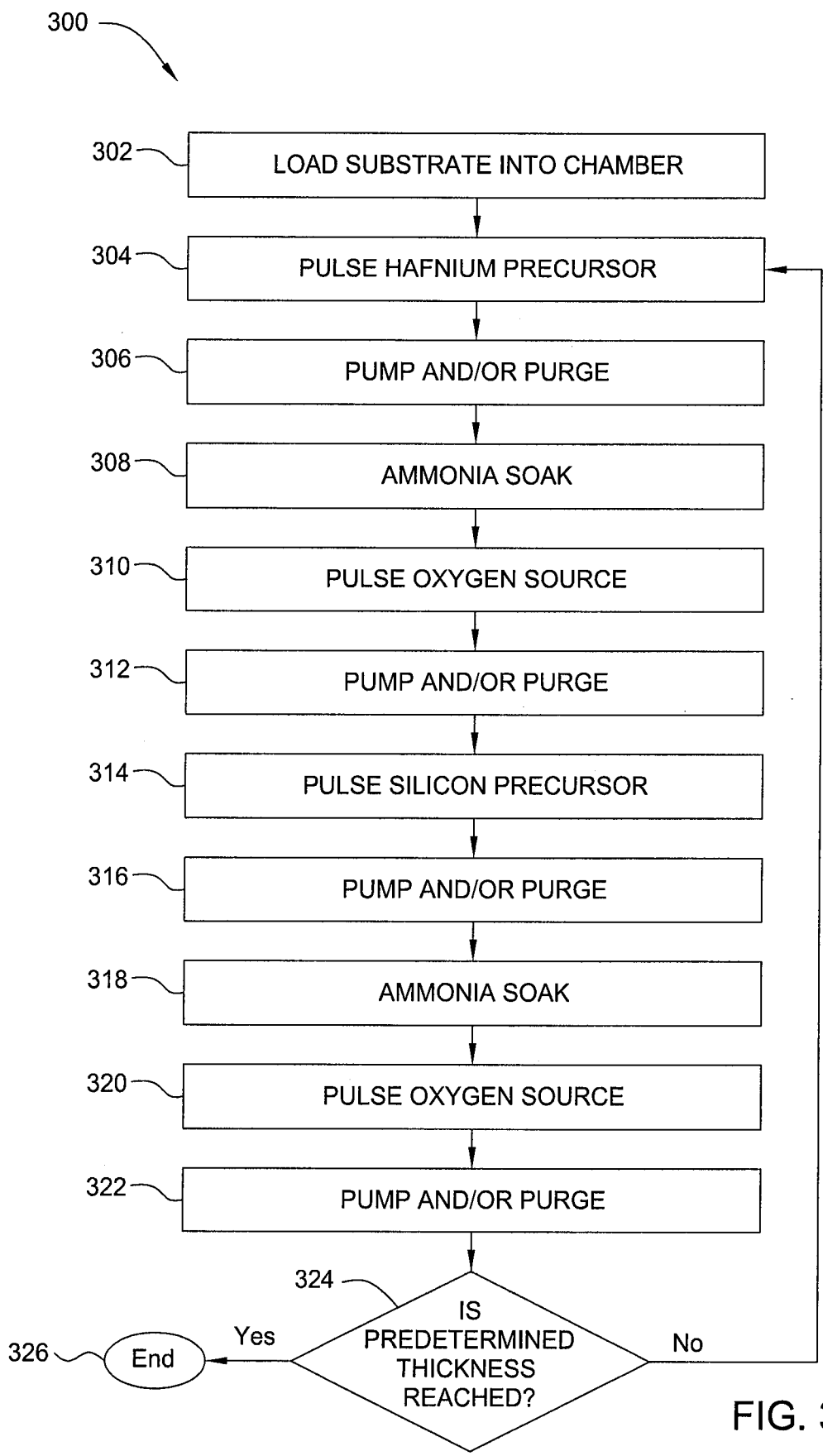
FIG. 3 is a flow chart 300 of a deposition method according to another embodiment of the invention.

FIG. 3 is a flow chart 300 of a deposition method according to another embodiment of the invention. Initially, one or more substrates may be placed into the process chamber (Step 302). The substrates may then optionally be exposed to an ammonia soak. The ammonia soak may occur for at least 10 seconds. Following the optional ammonia soak, a pulse of hafnium precursor may be introduced to the chamber (Step 304). While the hafnium precursor is introduced to the chamber, the ammonia may optionally be provided to the chamber.

Following the pulse of hafnium precursor, the chamber may be purged and/or pumped (Step 306) as described above. Following the pumping and/or purging, an ammonia soak may occur (Step 308). After the ammonia soak, a pulse of oxygen source such as water may be introduced to the chamber (Step 310). While the oxygen source is introduced to the chamber, ammonia may optionally be co-flowed into the chamber. The ammonia and the oxygen source such as water may be provided to the chamber through the same conduit or through separate conduits.

After the pulse of oxygen source has been provided to the chamber, the chamber may be pumped and/or purged again as described above (Step 312). After the pumping and/or purging, another ammonia soak may optionally occur. Thereafter, a silicon precursor may be pulsed into the chamber (Step 314). While the silicon precursor is introduced to the chamber, the ammonia may optionally be provided to the chamber.

Following the silicon precursor pulse, the chamber may again be pumped and/or purged (Step 316).

Following the pumping and/or purging, the substrate may be exposed to another ammonia soak (Step 318). The ammonia soak may occur under the same processing conditions present for the ammonia soaks discussed above. Following the ammonia soak, a pulse of oxidizing source such as $H_2O$ may be introduced to the chamber (Step 320). Following the exposure of the substrate to the oxidizing source such as $H_2O$, another pumping and/or purging cycle (Step 322) may be performed under conditions as discussed above.

After the chamber has been pumped and/or purged, the thickness of the hafnium silicate layer may be measured to determine if the predetermined thickness of hafnium silicate has been reached (Step 324). If the predetermined thickness has not been reached, the deposition sequence may be repeated. If the predetermined thickness has been reached, then the process ends (Step 326).

Figure 4:
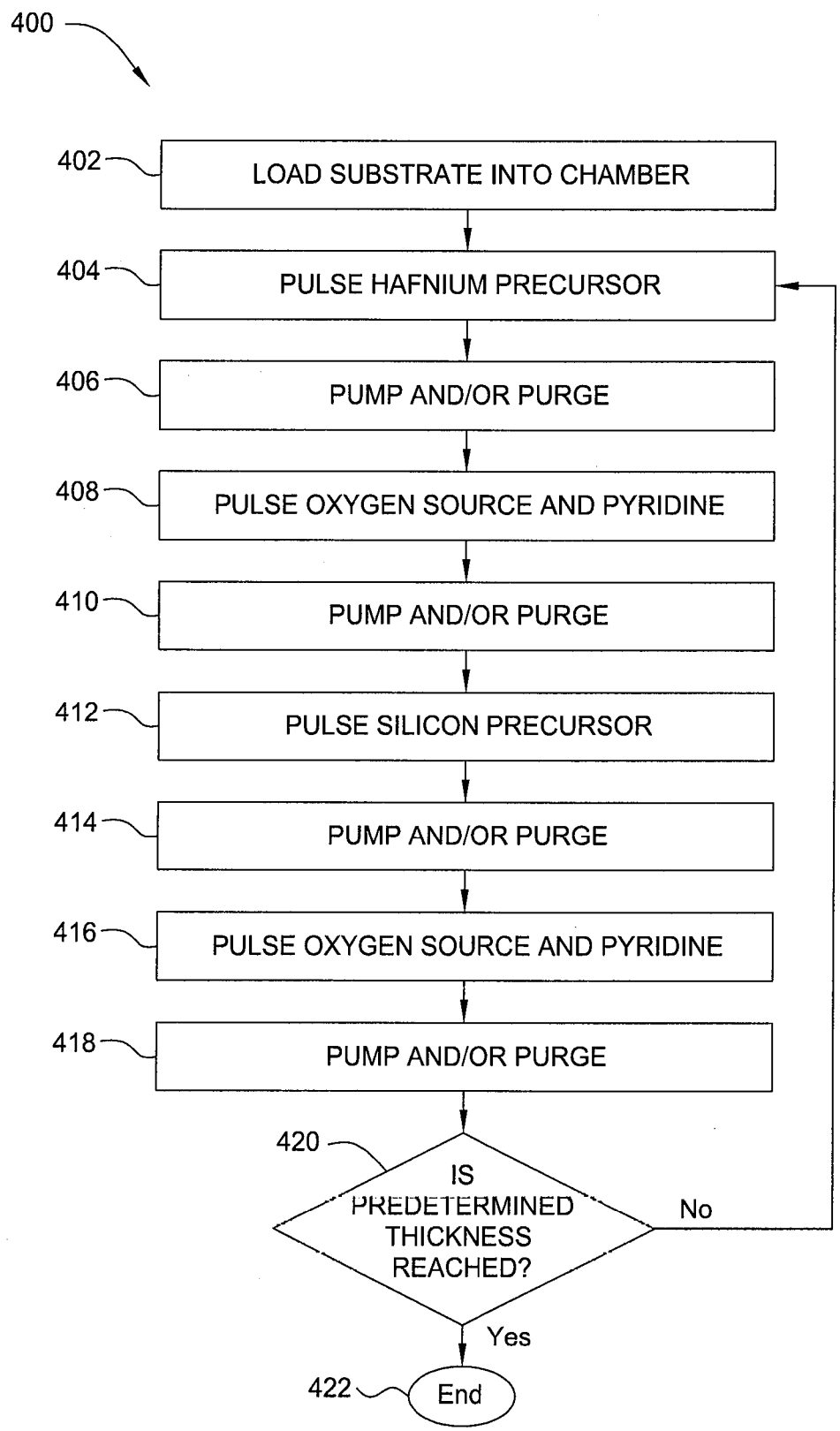
FIG. 4 is a flow chart 400 of a deposition method according to yet another embodiment of the invention.

FIG. 4 is a flow chart 400 of a deposition method according to yet another embodiment of the invention. Initially, one or more substrates may be placed into the process chamber (Step 402). A pulse of hafnium precursor may be introduced to the chamber (Step 404). Pyridine may optionally be co-flowed to the chamber with the hafnium precursor in a manner similar to that discussed above. Following the pulse of hafnium precursor, the chamber may be purged and/or pumped (Step 406) as described above.

Following the pumping and/or purging, a pulse of oxygen source such as water may be introduced to the chamber (Step 408). While the oxygen source is introduced to the chamber, pyridine may be co-flowed into the chamber. The pyridine and water will have separate inlets into the chamber so that the water and the pyridine do not flow to the chamber through the same conduit and inlet at the same time.

After the pulse of oxygen source and pyridine has been provided to the chamber, the chamber may be pumped and/or purged again as described above (Step 410). Thereafter, a silicon precursor may be pulsed into the chamber (Step 412). Pyridine may optionally be co-flowed to the chamber with the silicon precursor in a manner similar to that discussed above. Following the silicon precursor pulse, the chamber may again be pumped and/or purged (Step 414).

Following the pumping and/or purging, a pulse of oxidizing source such as $H_2O$ may be introduced to the chamber (Step 416). While the oxygen source is introduced to the chamber, pyridine may be co-flowed into the chamber. The pyridine and water will have separate inlets into the chamber so that the water and the pyridine do not flow to the chamber through the same conduit and inlet at the same time. Following the exposure of the substrate to the oxidizing source such as $H_2O$, another pumping and/or purging cycle (Step 418) may be performed under conditions as discussed above.

After the chamber has been pumped and/or purged, the thickness of the hafnium silicate layer may be measured to determine if the predetermined thickness of hafnium silicate has been reached (Step 420). If the predetermined thickness has not been reached, the deposition sequence may be repeated. If the predetermined thickness has been reached, then the process ends (Step 422).

Figure 5:
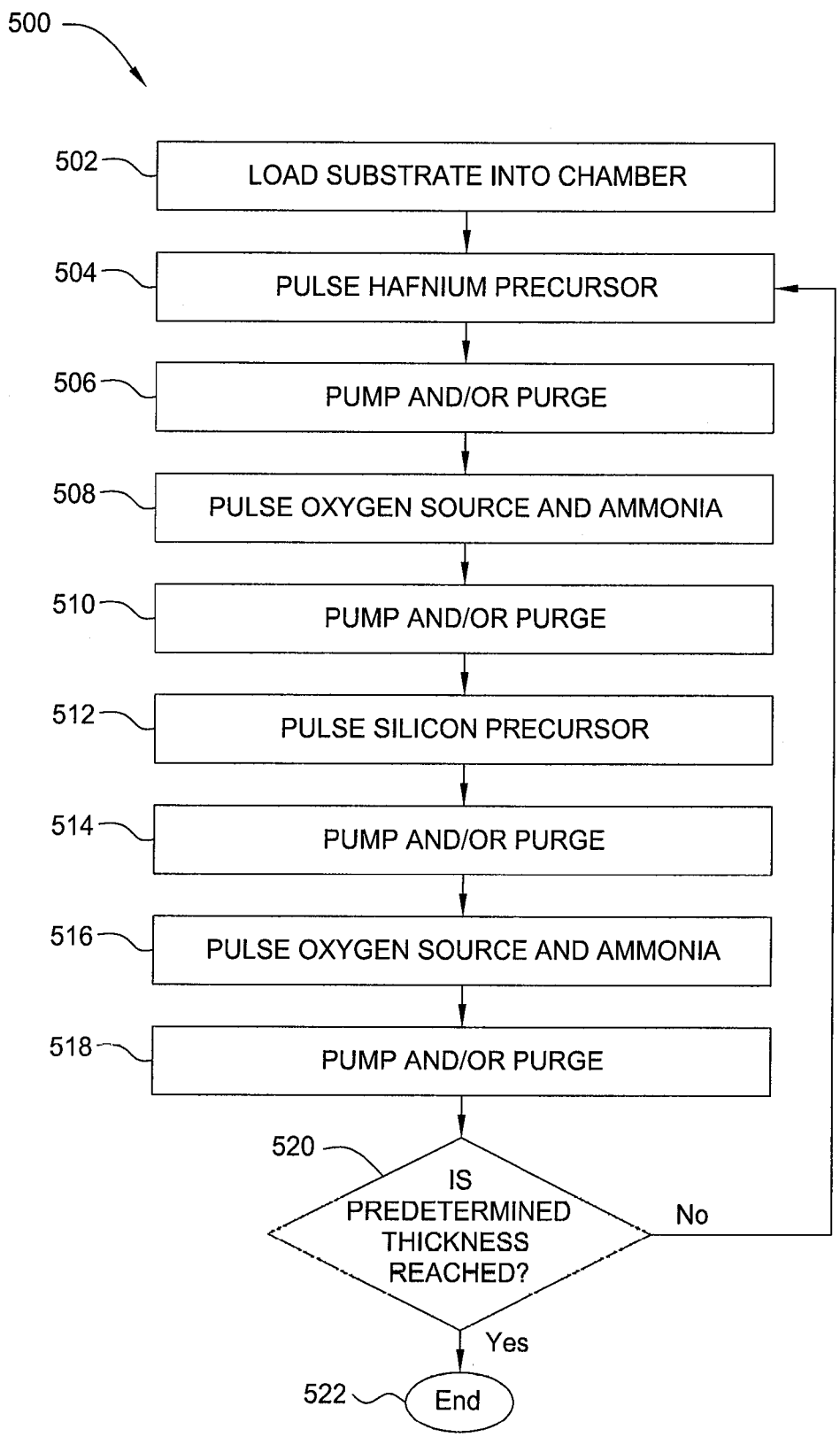
FIG. 5 is a flow chart 500 of a deposition method according to still another embodiment of the invention.

FIG. 5 is a flow chart 500 of a deposition method according to still another embodiment of the invention. Initially, one or more substrates may be placed into the process chamber (Step 502). A pulse of hafnium precursor may be introduced to the chamber (Step 504). Ammonia may optionally be co-flowed to the chamber with the hafnium precursor in a manner similar to that discussed above. Following the pulse of hafnium precursor, the chamber may be purged and/or pumped (Step 506) as described above.

Following the pumping and/or purging, a pulse of oxygen source such as water may be introduced to the chamber (Step 508). While the oxygen source is introduced to the chamber, ammonia may be co-flowed into the chamber. The water and the ammonia may be co-flowed through separate conduits and inlets or through the same conduits and inlets.

After the pulse of oxygen source and ammonia has been provided to the chamber, the chamber may be pumped and/or purged again as described above (Step 510). Thereafter, a silicon precursor may be pulsed into the chamber (Step 512). Ammonia may optionally be co-flowed to the chamber with the silicon precursor in a manner similar to that discussed above. Following the silicon precursor pulse, the chamber may again be pumped and/or purged (Step 514).

Following the pumping and/or purging, a pulse of oxidizing source such as $H_2O$ may be introduced to the chamber (Step 516). While the oxygen source is introduced to the chamber, ammonia may be co-flowed into the chamber. The ammonia and water may flow through the same or separate conduits and inlets as discussed above. Following the exposure of the substrate to the oxidizing source such as $H_2O$, another pumping and/or purging cycle (Step 518) may be performed under conditions as discussed above.

After the chamber has been pumped and/or purged, the thickness of the hafnium silicate layer may be measured to determine if the predetermined thickness of hafnium silicate has been reached (Step 520). If the predetermined thickness has not been reached, the deposition sequence may be repeated. If the predetermined thickness has been reached, then the process ends (Step 522).

It should be understood that when reference is made to processing a substrate, multiple substrates may be processed. For example, about 2 substrates, about 25 substrates, about 50 substrates, or about 100 substrates may be processed in a batch chamber. Additionally, the pyridine soak may occur for a time period of about 1 second to about 90 minutes or about 1 minute to about 20 minutes. Alternatively, the pyridine soak may occur for about 30 seconds to about 60 minutes to about 20 minutes to about 40 minutes. In still another alternative, the pyridine soak may occur for about 1 minute to about 40 minutes.

By providing a pyridine soak and/or co-flowing pyridine and $H_2O$ through separate conduit lines, sufficient pyridine reaches the chamber and hence, the substrate surface, to ensure that pyridine acts as a catalyst. By utilizing pyridine as a catalyst in an $H_2O$ oxidizing atmosphere, hafnium silicate ALD may occur at an increased rate in a temperature range of about 150 degrees Celsius to about 200 degrees Celsius. Additionally, by providing an ammonia soak and or co-flowing the ammonia with the oxidizing source, a hafnium silicate layer may be deposited by ALD at an increased rate in a temperature range of about 150 degrees Celsius to about 200 degrees Celsius.

While the foregoing is directed to embodiments of the present invention, other and further embodiments of the invention may be devised without departing from the basic scope thereof, and the scope thereof is determined by the claims that follow.

The invention claimed is:

1. A high-k silicate deposition method, sequentially comprising:
   (a) positioning at least one substrate in a chamber;
   (b) exposing the at least one substrate to a hafnium precursor;

(c) exposing the at least one substrate to a first pyridine soak;

(d) exposing the at least one substrate to a first oxidizing source;

(e) exposing the at least one substrate to a silicon precursor;

(f) exposing the at least one substrate to a second pyridine soak; and then (g) exposing the at least one substrate to a second oxidizing source.

2. The method of claim 1, wherein the silicon precursor is selected from the group consisting of hexachlorodisilane and tetrakis-ethoxy-silane.

3. The method of claim 1, further comprising:
exposing the at least one substrate to a purge gas.

4. The method of claim 1, wherein the hafnium precursor is selected from the group consisting of TDMAH, TEMAH, TDEAH, and $HfCl_4$.

5. The method of claim 1, further comprising:
repeating (b)-(g) one or more times.

6. The method of claim 1, wherein the first and second oxidizing sources are selected from the group consisting of $H_2O$, $O_3$, $O_2$, or radical oxygen.

7. The method of claim 1, wherein the silicon precursor comprises hexachlorodisilane.

8. The method of claim 1, wherein the silicon precursor comprises tetrakis-ethoxy-silane.

9. The method of claim 1, wherein the at least one substrate positioned in the chamber comprises two or more substrates.

10. The method of claim 1, wherein the at least one substrate positioned in the chamber comprises about 50 substrates.

11. The method of claim 1, wherein the silicon precursor is tetrakis-ethoxy-silane and the hafnium precursor is TDMAH.

12. A high-k silicate deposition method, sequentially comprising:

(a) positioning at least one substrate in a chamber;

(b) exposing the at least one substrate to a high-k precursor;

(c) exposing the at least one substrate to a first oxidizing source and pyridine, the pyridine and the first oxidizing source flowing into the chamber through separate inlets;

(d) exposing the at least one substrate to a silicon precursor; and then (e) exposing the at least one substrate to a second oxidizing source and pyridine, the pyridine and the second oxidizing source flowing into the chamber through separate inlets.

13. The method of claim 12, wherein the silicon precursor is selected from the group consisting of hexachlorodisilane and tetrakis-ethoxy-silane.

14. The method of claim 13, wherein the silicon precursor comprises hexachlorodisilane.

15. The method of claim 13, wherein the silicon precursor comprises tetrakis-ethoxy-silane.

16. The method of claim 12, further comprising:
exposing the at least one substrate to a purge gas.

17. The method of claim 12, wherein the high-k precursor is a hafnium precursor selected from the group consisting of TDMAH, TEMAH, TDEAH, and $HfCl_4$.

18. The method of claim 17, wherein the oxidizing source is $O_2$, the hafnium precursor is $HfCl_4$, and the silicon precursor is tetrakis-ethoxy-silane.

19. The method of claim 12, further comprising:
repeating (b)-(e) one or more times.

20. The method of claim 12, wherein the first and second oxidizing sources are selected from the group consisting of $H_2O$, $O_3$, $O_2$, or radical oxygen.

21. The method of claim 12, wherein the at least one substrate positioned in the chamber comprises two or more substrates.

22. The method of claim 12, wherein the at least one substrate positioned in the chamber comprises about 50 substrates.

23. A hafnium silicate deposition method, sequentially comprising:
positioning at least one substrate in a chamber;
exposing the at least one substrate to a hafnium precursor;
exposing the at least one substrate to water and pyridine, the water and pyridine flowing into the chamber through separate inlets;
exposing the at least one substrate to hexachlorodisilane; and then
exposing the at least one substrate to water and pyridine, the water and pyridine flowing into the chamber through separate inlets.

24. The method of claim 23, wherein the at least one substrate positioned in the chamber comprises two or more substrates.

25. The method of claim 23, wherein the at least one substrate positioned in the chamber comprises about 50 substrates.

26. The method of claim 23, further comprising exposing the at least one substrate to pyridine prior to exposing the at least one substrate to the hafnium precursor.

* * * * *